(12) United States Patent
Ye et al.

(10) Patent No.: US 7,649,265 B2
(45) Date of Patent: Jan. 19, 2010

(54) MICRO-VIA STRUCTURE DESIGN FOR HIGH PERFORMANCE INTEGRATED CIRCUITS

(75) Inventors: Chunfei Ye, Olympia, WA (US); Boping Wu, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 11/541,124

(22) Filed: Sep. 29, 2006

(65) Prior Publication Data

US 2008/0079139 A1 Apr. 3, 2008

(51) Int. Cl.
*H01L 23/498* (2006.01)

(52) U.S. Cl. .................. 257/774; 257/698; 257/700; 257/E23.067

(58) Field of Classification Search ................ 257/698, 257/700, 774, E23.067
See application file for complete search history.

(56) References Cited

U.S. PATENT DOCUMENTS

| | | | |
|---|---|---|---|
| 2005/0156319 A1* | 7/2005 | Oggioni et al. | 257/774 |
| 2006/0180905 A1* | 8/2006 | Zeng et al. | 257/678 |
| 2007/0197099 A1* | 8/2007 | DiStefano | 439/620.1 |
| 2008/0073796 A1* | 3/2008 | Harvey et al. | 257/774 |

* cited by examiner

*Primary Examiner*—Victor A Mandala
(74) *Attorney, Agent, or Firm*—David L. Guglielmi

(57) ABSTRACT

In some embodiments, a micro-via structure design for high performance integrated circuits is presented. In this regard, an integrated circuit chip package is introduced having a dielectric layer, a plated throughhole in the dielectric layer, and a micro-via coupled with the plated throughhole, wherein the micro-via forms a path around an axis. Other embodiments are also disclosed and claimed.

19 Claims, 5 Drawing Sheets

MICRO-VIA STRUCTURE DESIGN FOR HIGH PERFORMANCE INTEGRATED CIRCUITS

FIELD OF THE INVENTION

Embodiments of the present invention generally relate to the field of integrated circuit packages, and, more particularly to a micro-via structure design for high performance integrated circuits.

BACKGROUND OF THE INVENTION

Integrated circuit devices transmit and receive data at ever faster speeds. This data typically is routed through a package substrate core by a plated throughhole (PTH). With high speed transmissions, however, a PTH can produce capacitive loading which can lead to impedance discontinuity.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
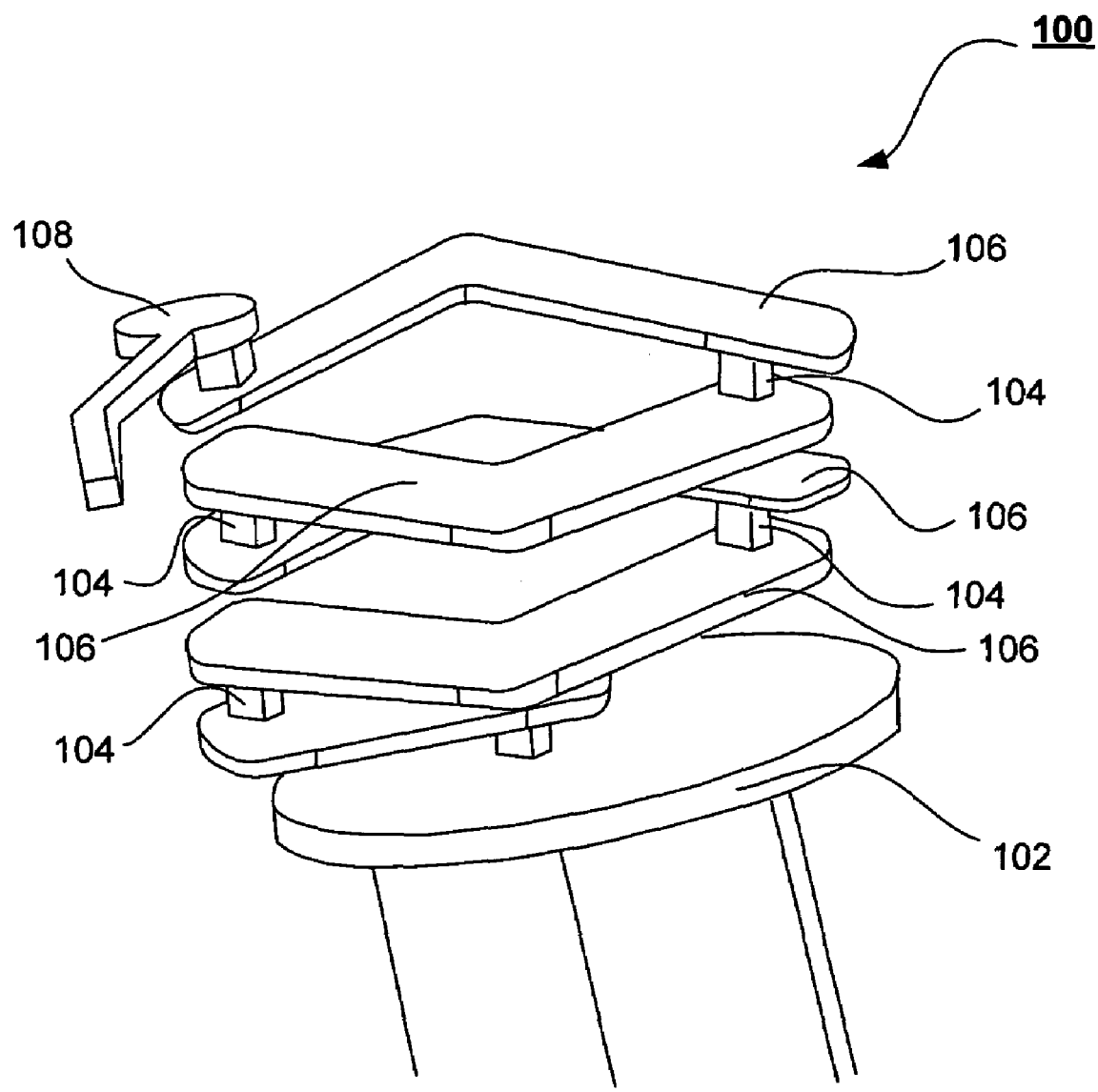
FIG. 1 is a graphical illustration of a three-dimensional view of a micro-via structure design for high performance integrated circuits, in accordance with one example embodiment of the invention.

FIG. 1 is a graphical illustration of a three-dimensional view of a micro-via structure design for high performance integrated circuits, in accordance with one example embodiment of the invention. In accordance with the illustrated example embodiment, micro-via structure 100 includes one or more of plated throughhole (PTH) interface 102, rise layers 104, path layers 106 and contact 108.

PTH interface 102 couples micro-via structure 100 with a plated throughhole, which may go through a package substrate or a printed circuit board (PCB), and may be on the top and/or the bottom of the PTH.

Rise layers 104 couple path layers 106 with PTH interface 102 and contact 108. Although shown as rising vertically, rise layers 104 may rise at an angle from vertical potentially to contribute to the inductance of micro-via structure 100. The number of rise layers may depend on the number of dielectric layers needed to couple a PTH to a surface of a substrate. In some embodiments, rise layers 104 are not be needed, for example if path layers 106 were directly connected to one another.

Path layers 106 together form a path around an imaginary axis. In some embodiments, the axis is parallel, or even coaxial, with the PTH, while in other embodiments the axis is not parallel with the PTH. The axis may be vertical or non-vertical or may not be a straight alignment. While the path formed by path layers 106 as shown is rectangular, the path may take any shape including circular, triangular, or any other polygon shape. One skilled in the art would appreciate that by forming a path around an axis, micro-via structure 100 may provide inductance which may at least partially offset capacitance introduced by the PTH, thereby helping to manage impedance in the transmission line. Each path layer 106 may be patterned and electro-plated into a substrate or micro-via structure 100 may be pre-fabricated and placed into contact with the PTH.

While shown as making two loops around the imaginary axis, micro-via structure 100 may contain more or fewer loops. While each path layer 106 as shown includes one ninety degree turn, the present invention is not so limited and there may be more than one turn at any angle(s) or no turns in a particular layer.

Contact 108 couples micro-via structure 100 with other parts in the IC package.

Figure 2:
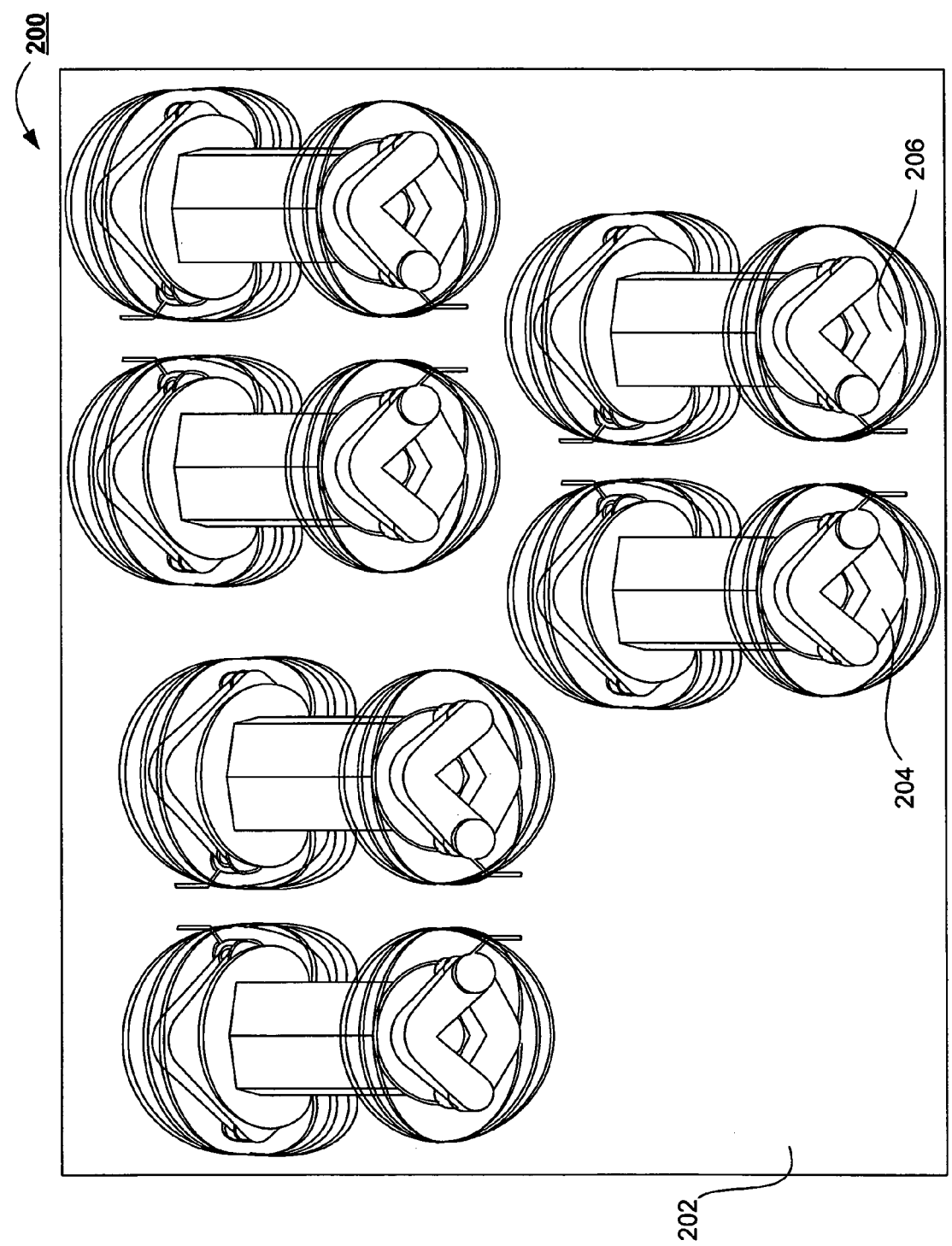
FIG. 2 is a graphical illustration of a three-dimensional view of a micro-via structure design for high performance integrated circuits, in accordance with one example embodiment of the invention.

FIG. 2 is a graphical illustration of a three-dimensional view of a micro-via structure design for high performance integrated circuits, in accordance with one example embodiment of the invention. As shown, micro-via array 200 includes one or more of dielectric material 202, micro-via 204 and micro-via 206.

Micro-via array 200 includes a plurality of plated throughholes (PTH), through dielectric material 202, coupled with micro-vias similar to micro-via structure 100. The PTH's may be grouped based on the signals they are designed to transmit. In one embodiment, micro-vias 204 and 206 comprise a differential pair. To match the signals as closely as possible, micro-vias 204 and 206 may be mirror images of each other with corresponding turns and rises.

Figure 3:
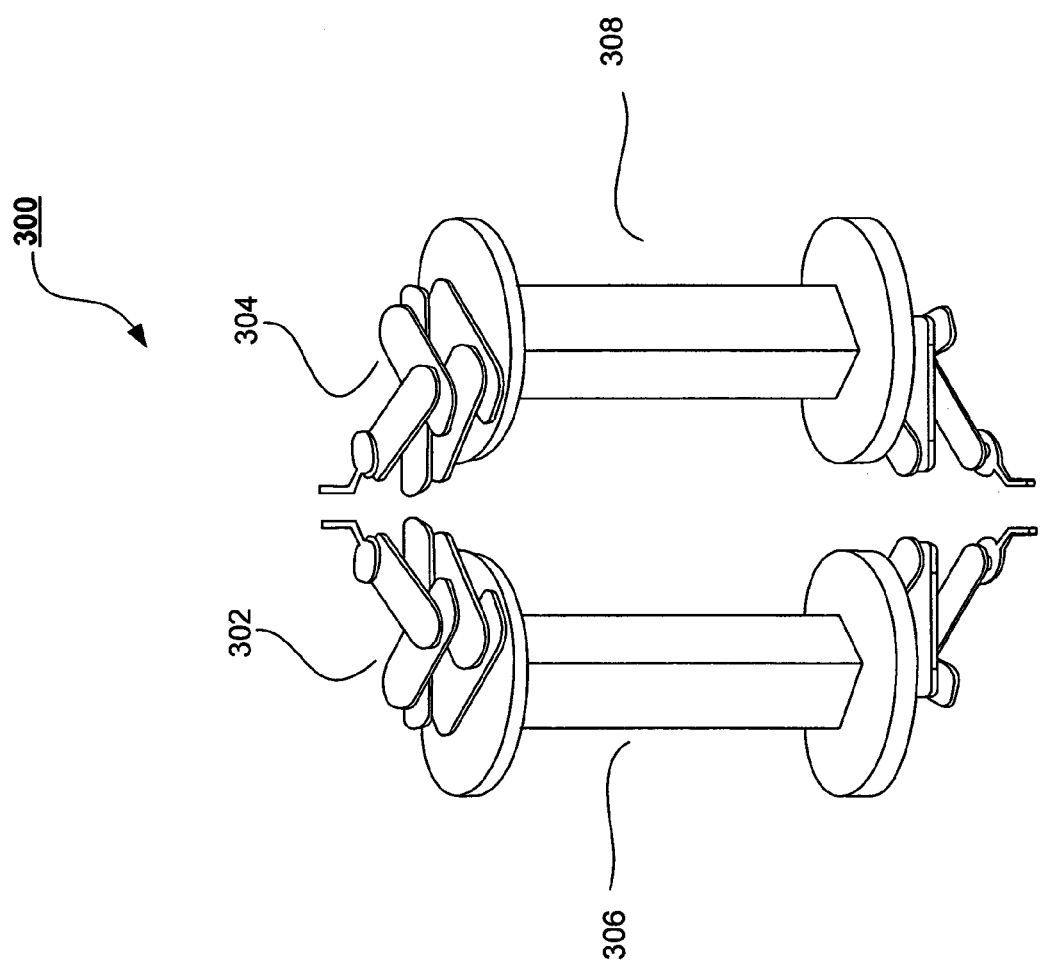
FIG. 3 is a graphical illustration of a three-dimensional view of a micro-via structure design for high performance integrated circuits, in accordance with one example embodiment of the invention.

FIG. 3 is a graphical illustration of a three-dimensional view of a micro-via structure design for high performance integrated circuits, in accordance with one example embodiment of the invention. As shown, differential pair 300 includes one or more of micro-vias 302 and 304 and PTH's 306 and 308.

Micro-vias 302 and 304 represent another embodiment of the present invention. In this embodiment, the micro-via path around the imaginary axis is triangular. Also in this embodiment, the axes do not correspond to the center of the PTH's. PTH's 306 and 308 may go through a substrate, PCB, or other dielectric material (not shown).

Figure 4:
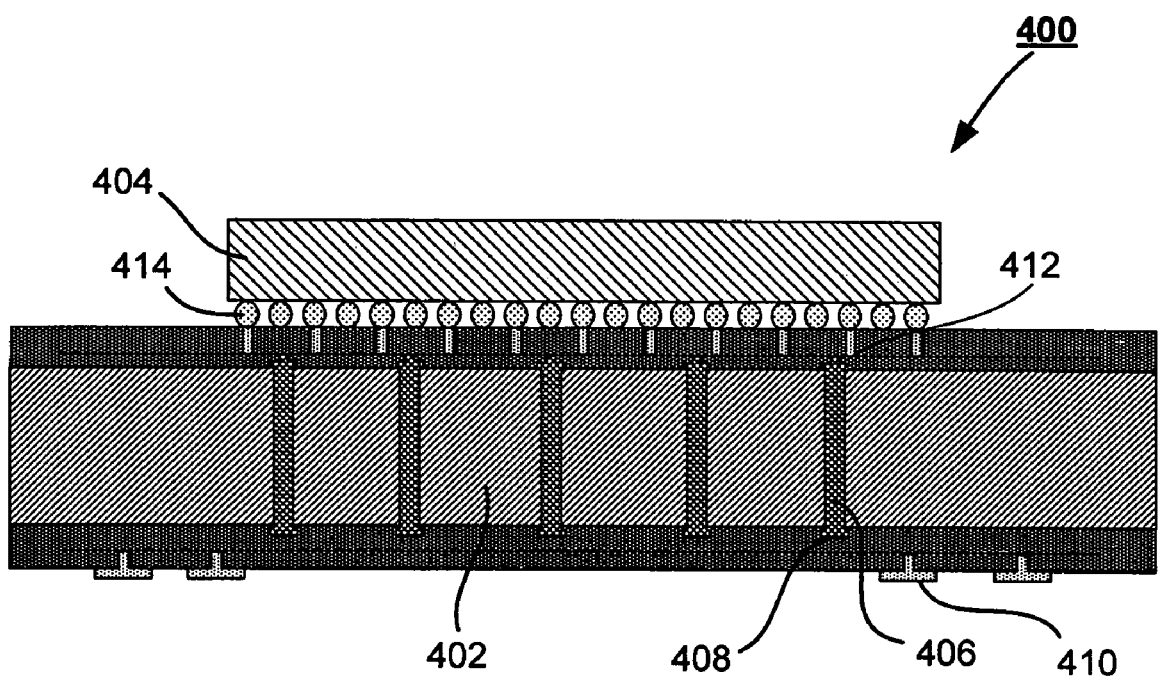
FIG. 4 is a graphical illustration of a cross-sectional view of an integrated circuit package suitable for implementing a micro-via structure design for high performance integrated circuits, in accordance with one example embodiment of the invention.

FIG. 4 is a graphical illustration of a cross-sectional view of an integrated circuit package suitable for implementing a micro-via structure design for high performance integrated circuits, in accordance with one example embodiment of the invention. As shown, package 400 includes one or more of substrate 402, IC die 404, plated throughholes 406, bottom micro-vias 408, package contacts 410, top micro-vias 412, and die bumps 414.

In one embodiment substrate 402 represents an organic substrate, such as epoxy based dielectric, that has been manufactured through a build-up process.

IC die 404 may represent any type of integrated circuit device or devices, for example a multi-core processor.

PTH's 406 may be formed by plating a hole that was drilled through substrate 402. Bottom micro-vias 408 and top micro-vias 412 include features as described previously as an embodiment of the present invention and are connected to the bottom and top, respectively of PTH's 406.

Package connections 410 are connected with bottom micro-vias 408 and provide an interface between IC package 400 and other components, for example through a socket Die bumps 414 may provide the mechanical and electrical connection between top micro-vias 412 and die 404.

Figure 5:
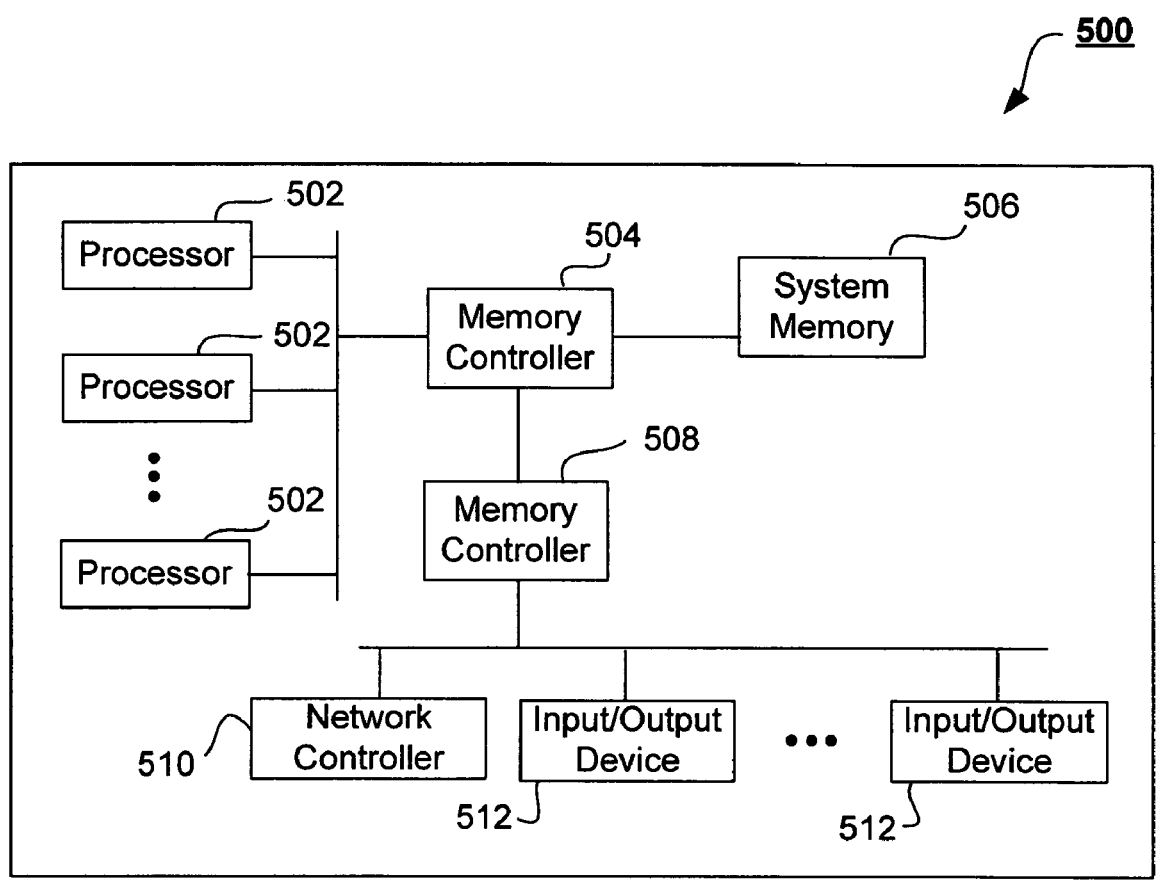
FIG. 5 is a block diagram of an example electronic appliance suitable for implementing a micro-via structure design for high performance integrated circuits, in accordance with one example embodiment of the invention.

FIG. 5 is a block diagram of an example electronic appliance suitable for implementing a micro-via structure design for high performance integrated circuits, in accordance with one example embodiment of the invention. Electronic appliance 500 is intended to represent any of a wide variety of traditional and non-traditional electronic appliances, laptops, desktops, servers, data centers, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 500 may include one or more of processor(s) 502, memory controller 504, system memory 506, input/output controller 508, network controller 510, and input/output device(s) 512 coupled as shown in FIG. 5. Processor(s) 502, or other integrated circuit components of electronic appliance 500, may be housed in a package including a substrate with micro-vias described previously as an embodiment of the present invention.

Processor(s) 502 may represent any of a wide variety of control logic including, but not limited to one or more of a microprocessor, a programmable logic device (PLD), programmable logic array (PLA), application specific integrated circuit (ASIC), a microcontroller, field programmable gate array (FPGA), and the like, although the present invention is not limited in this respect. In one embodiment, processors(s) 502 are Intel® compatible processors. Processor(s) 502 may have an instruction set containing a plurality of machine level instructions that may be invoked, for example by an application or operating system.

Memory controller 504 may represent any type of chipset or control logic that interfaces system memory 508 with the other components of electronic appliance 500. In one embodiment, the connection between processor(s) 502 and memory controller 504 may be referred to as a front-side bus. In another embodiment, memory controller 504 may be referred to as a north bridge.

System memory 506 may represent any type of memory device(s) used to store data and instructions that may have been or will be used by processor(s) 502. Typically, though the invention is not limited in this respect, system memory 506 will consist of dynamic random access memory (DRAM). In one embodiment, system memory 506 may consist of Rambus DRAM (RDRAM). In another embodiment, system memory 506 may consist of double data rate synchronous DRAM (DDRSDRAM).

Input/output (I/O) controller 508 may represent any type of chipset or control logic that interfaces I/O device(s) 512 with the other components of electronic appliance 500. In one embodiment, I/O controller 508 may be referred to as a south bridge. In another embodiment, I/O controller 508 may comply with the Peripheral Component Interconnect (PCI) Express™ Base Specification, Revision 1.0a, PCI Special Interest Group, released Apr. 15, 2003.

Network controller 510 may represent any type of device that allows electronic appliance 500 to communicate with other electronic appliances or devices. In one embodiment, network controller 510 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 510 may be an Ethernet network interface card.

Input/output (I/O) device(s) 512 may represent any type of device, peripheral or component that provides input to or processes output from electronic appliance 500.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An integrated circuit chip package comprising:
    a dielectric layer;
    a plated throughhole in the dielectric layer; and
    a micro-via coupled with the plated throughhole, wherein the micro-via comprises a plurality of substantially horizontal path layers including a single point of contact between substantially horizontal path layers, wherein the substantially horizontal path layers each contain only a portion of a geometric shape and that only in combination form a closed path around an axis.

2. The integrated circuit chip package of claim 1, wherein the axis is substantially vertical.

3. The integrated circuit chip package of claim 2, wherein the path is substantially rectangular in shape.

4. The integrated circuit chip package of claim 2, wherein the path is substantially circular in shape.

5. The integrated circuit chip package of claim 2, wherein the path comprises at least one loop around the axis.

6. The integrated circuit chip package of claim 2, wherein the path comprises one or more turns in a same layer.

7. The integrated circuit chip package of claim 1, wherein the path comprises a rise at an angle from vertical.

8. An apparatus comprising:
    an integrated circuit die; and a substrate, including a dielectric layer, a plurality of plated throughholes in the dielectric layer, and micro-vias coupled with the plated throughholes, wherein the micro-vias comprise a plurality of substantially horizontal path layers including a single point of contact between substantially horizontal path layers, wherein the substantially horizontal path layers each contain only a portion of a geometric shape and that only in combination form a closed path around an axis substantially parallel with the coupled plated throughholes.

9. The apparatus of claim 8, wherein the path is substantially triangular in shape.

10. The apparatus of claim 8, wherein the path is polygonal in shape.

11. The apparatus of claim 8, wherein the path comprises one or more turns in a same layer.

12. An electronic appliance comprising:
   a network controller;
   a system memory; and
   a processor, wherein the processor includes a substrate, including a dielectric layer, a plated throughhole in the dielectric layer, and a micro-via coupled with the plated throughhole, wherein the micro-via comprises a plurality of substantially horizontal path layers including a single point of contact between substantially horizontal path layers, wherein the substantially horizontal path layers each contain only a portion of a geometric shape and that only in combination form a closed path around an axis.

13. The electronic appliance of claim 12, wherein the path comprises at least one loop around the axis.

14. The electronic appliance of claim 12, wherein the path is polygonal in shape.

15. The electronic appliance of claim 12, wherein the path comprises one or more turns in a same layer.

16. A method comprising:
   forming a plated through-hole; and
   forming a micro-via coupled with the throughhole, wherein the micro-via comprises a plurality of substantially horizontal path layers including a single point of contact between substantially horizontal path layers, wherein the substantially horizontal path layers each contain only a portion of a geometric shape and that only in combination form a closed path around an axis.

17. The method of claim 16, wherein the path is substantially circular in shape.

18. The method of claim 16, wherein the path is substantially rectangular in shape.

19. The method of claim 16, wherein the path comprises one or more turns in a same layer.

* * * * *